(12) United States Patent
Suzuki et al.

(10) Patent No.: US 11,027,968 B2
(45) Date of Patent: Jun. 8, 2021

(54) SEMICONDUCTOR DEVICE WITH DISCHARGE PATH, AND METHOD FOR PRODUCING THE SAME

(71) Applicant: DENSO CORPORATION, Kariya (JP)

(72) Inventors: Megumi Suzuki, Kariya (JP); Teruhisa Akashi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/805,112

(22) Filed: Feb. 28, 2020

(65) Prior Publication Data

US 2020/0299128 A1  Sep. 24, 2020

(30) Foreign Application Priority Data

Mar. 20, 2019 (JP) .............................. JP2019-053429

(51) Int. Cl.
  *B81C 1/00* (2006.01)
  *B81B 7/00* (2006.01)
(52) U.S. Cl.
  CPC ........ *B81C 1/00309* (2013.01); *B81B 7/0061* (2013.01); *B81B 2201/0242* (2013.01); *B81B 2203/0315* (2013.01); *B81B 2207/096* (2013.01); *B81C 2203/019* (2013.01); *B81C 2203/038* (2013.01)
(58) Field of Classification Search
  CPC .......... B81C 1/00309; B81C 2203/038; B81C 2203/019; B81B 7/0061; B81B 2201/0242; B81B 2207/096; B81B 2203/0315; B81B 7/0041; H01L 21/50
  See application file for complete search history.

(56) References Cited

U.S. PATENT DOCUMENTS

| | | | |
|---|---|---|---|
| 2004/0077117 A1* | 4/2004 | Ding | H01L 23/055 438/51 |
| 2004/0183214 A1 | 9/2004 | Partridge et al. | |
| 2005/0176179 A1* | 8/2005 | Ikushima | H01L 37/00 438/125 |
| 2009/0309175 A1 | 12/2009 | Partridge et al. | |
| 2011/0298065 A1 | 12/2011 | Partridge et al. | |
| 2015/0353346 A1* | 12/2015 | Heuck | B81B 7/02 257/415 |
| 2016/0003650 A1 | 1/2016 | Kanamaru et al. | |
| 2017/0284882 A1* | 10/2017 | Baldo | G01L 9/0072 |
| 2018/0312396 A1* | 11/2018 | Lee | B81B 7/0038 |

FOREIGN PATENT DOCUMENTS

JP    2010-251568 A   11/2010
JP    4645028 B2      3/2011

* cited by examiner

*Primary Examiner* — Yasser A Abdelaziez
(74) *Attorney, Agent, or Firm* — Posz Law Group, PLC

(57) ABSTRACT

In a semiconductor device, a first substrate and a second substrate are bonded to each other through an insulating film. A hermetically sealed chamber is provided between the first substrate and the second substrate, and a sensing part is enclosed in the hermetically sealed chamber. The second substrate has a through hole penetrating in a stacking direction of the first substrate and the second substrate and exposing the first surface of the first substrate. A penetrating electrode is disposed on a wall surface of the through hole of the second substrate, and is electrically connected to the sensing part. A discharge path is provided, at a position located between the hermetically sealed chamber and the through hole for releasing outgas generated during bonding from the hermetically sealed chamber to the through hole.

7 Claims, 8 Drawing Sheets

SEMICONDUCTOR DEVICE WITH DISCHARGE PATH, AND METHOD FOR PRODUCING THE SAME

CROSS REFERENCE TO RELATED APPLICATION

The present application claims the benefit of priority from Japanese Patent Application No. 2019-53429 filed on Mar. 20, 2019, and the entire disclosures of which are incorporated herein by reference.

TECHNICAL FIELD

The present disclosure relates to a semiconductor device including a first substrate and a second substrate bonded to each other so as to provide a hermetically sealed chamber therebetween, and a method for producing the semiconductor device.

BACKGROUND

It has been known a semiconductor device having a hermetically sealed chamber between a first substrate and a second substrate, and a sensing part enclosed in the hermetically sealed chamber. In such a semiconductor device, for example, the first substrate is formed with a sensing part for sensing an angular velocity, and the second substrate is formed with a recessed part on a surface at a position facing the sensing part. The second substrate is bonded to the first substrate so that a hermetically sealed chamber is provided by a space defined between the first substrate and the recessed part of the second substrate for enclosing the sensing part. The sensing part is, for example, configured to include a vibrator. The pressure inside of the hermetically sealed chamber is so low as to increase a quality factor (Q-factor) of the vibrator.

SUMMARY

The present disclosure describes a semiconductor device and a method for producing the semiconductor device. The semiconductor device includes a first substrate and a second substrate bonded to the first substrate through an insulating film. A hermetically sealed chamber is provided between the first substrate and the second substrate, and a sensing part is enclosed in the hermetically sealed chamber. The second substrate has a through hole penetrating the second substrate in a stacking direction of the first substrate and the second substrate and exposing the surface of the first substrate. A penetrating electrode is disposed on a wall surface of the through hole of the second substrate, and is electrically connected to the sensing part. A discharge path is provided, at a position located between the hermetically sealed chamber and the through hole for releasing outgas from the hermetically sealed chamber to the through hole.

BRIEF DESCRIPTION OF THE DRAWINGS

Objects, features and advantages of the present disclosure will become more apparent from the following detailed description made with reference to the accompanying drawings, in which.

DETAILED DESCRIPTION

Figure 1:
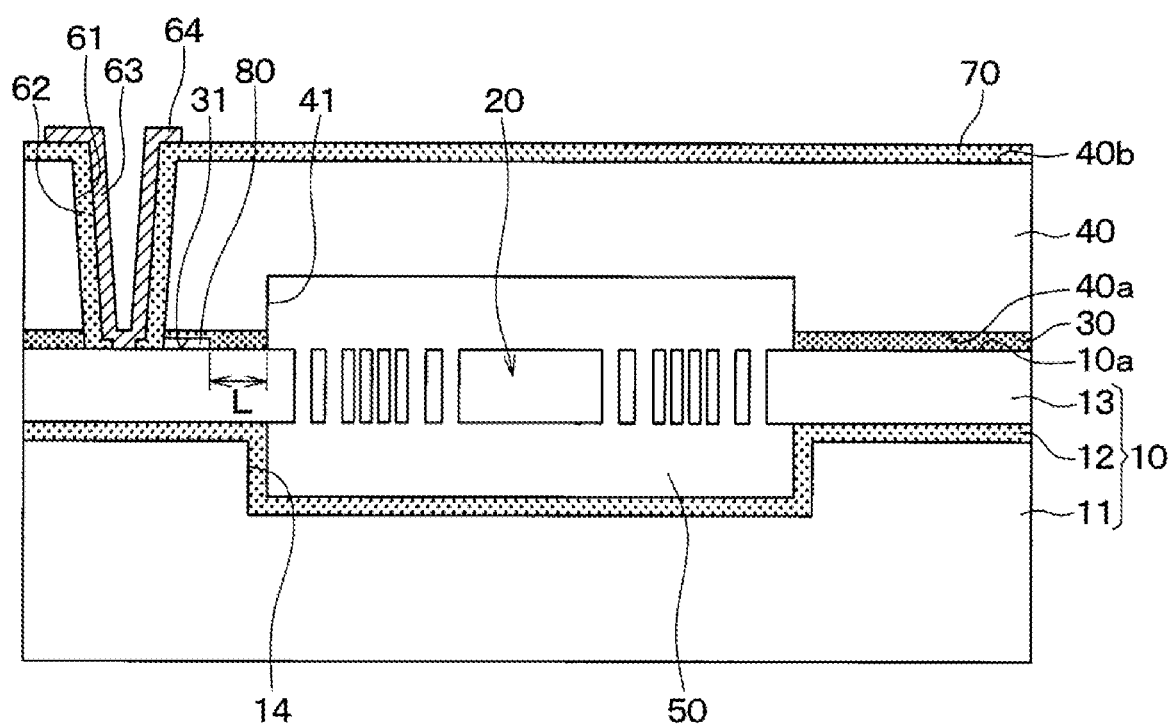
FIG. 1 is a diagram illustrating a cross-sectional view of a semiconductor device according to a first embodiment of the present disclosure.

A semiconductor device having a hermetically sealed chamber between a first substrate and a second substrate, and a sensing part for sensing a physical value enclosed in the hermetically sealed chamber may be produced in the following manner. Firstly, the sensing part is formed in the first substrate, and the recessed part is formed in the second substrate. The first substrate and the second substrate are bonded to each other so that the hermetically sealed chamber for enclosing the sensing part is formed by the space defined between the first substrate and the recessed part of the second substrate. The first substrate and the second substrate are bonded to each other by a surface activated bonding.

In such a production method, however, outgas, such as hydrogen gas or nitrogen gas, is likely to be generated during the bonding. As a result, the pressure of the hermetically sealed chamber may be affected by the outgas. In order to reduce influence of the outgas, it may be conceivable to enlarge the hermetically sealed chamber.

In the configuration where the hermetically sealed chamber is enlarged, however, the outgas remains in the hermetically sealed chamber. Thus, it is difficult to sufficiently reduce the pressure of the hermetically sealed chamber.

According to a first aspect of the present disclosure, a semiconductor device includes a first substrate having a first surface, a second substrate having a second surface, an insulating film, a sensing part, and a penetrating electrode. The first substrate and the second substrate are bonded to each other such that the first surface of the first substrate faces the second surface of the second substrate, and a hermetically sealed chamber is provided between the first substrate and the second substrate. The second substrate has a through hole that penetrates the second substrate in a stacking direction of the first substrate and the second substrate and exposes the first surface of the first substrate. The insulating film is disposed between the first surface of the first substrate and the second surface of the second substrate. The sensing part is disposed in the hermetically sealed chamber, and includes a vibrator. The penetrating electrode is disposed on a wall surface of the through hole of the second substrate. The penetrating electrode is electrically connected to the sensing part. The semiconductor device further includes a discharge path defining a space, at a position located between the hermetically sealed chamber and the through hole.

In such a configuration, when the semiconductor device is subjected to a heat treatment, outgas generated in the hermetically sealed chamber can be discharged into the through hole, hence the pressure of the hermetically sealed chamber can be reduced. In addition, since the outgas can be discharged into the through hole through the discharge path, the discharge of the outgas can be enhanced, as compared with a configuration without having the discharge path.

According to a second aspect of the present disclosure, a method for producing a semiconductor device, includes: preparing a first substrate having a first surface; forming a sensing part in the first substrate adjacent to the first surface; preparing a second substrate having a second surface; forming an insulating film on at least one of the first substrate and the second substrate; bonding the first surface of the first substrate and the second surface of the second substrate through the insulating film to provide a hermetically sealed chamber between the first substrate and the second substrate and to enclose the sensing part including a vibrator in the hermetically sealed chamber; forming a through hole in the second substrate and the insulating film in a stacking direction of the first substrate and the second substrate to expose the first surface of the first substrate; forming a penetrating electrode in the through hole to be electrically connected to the sensing part; and forming a recess, before the bonding, at a position that is to be located between the hermetically sealed chamber and the through hole in the bonding and the forming of the through hole. In the bonding, the first surface of the first substrate and the second surface of the second substrate are bonded through the insulating film so that a discharge path is provided by the recess at the position that is to be located between the hermetically sealed chamber and the through hole in the forming of the through hole. The method further includes, after the forming of the through hole and before the forming of the penetrating electrode, performing a heat treatment to release outgas, which is generated in the bonding, from the hermetically sealed chamber to the through hole through the discharge path.

In such a method, outgas is discharged from the hermetically sealed chamber to the through hole via the discharge path by the heat treatment, hence the pressure of the hermetically sealed chamber can be lowered. In addition, the distance of diffusing the outgas can be shortened, as compared with a configuration without having the discharge path. Therefore, the outgas can be readily discharged.

Embodiments of the present disclosure will be hereinafter described with reference to the drawings. Note that, in descriptions of the embodiments, the same or equivalent parts will be designated with the same reference numbers.

First Embodiment

A first embodiment will be described with reference to the drawings. In the present embodiment, a semiconductor device is configured exemplarily as an angular velocity sensor.

As shown in FIG. 1, the angular velocity sensor of the present embodiment includes a first substrate 10 having one surface 10*a* as a first surface. The first substrate 10 is a Silicon on Insulator (SOI) substrate in which a support substrate 11, an insulating film 12 and a semiconductor layer 13 are stacked in the stated order.

In the present embodiment, a surface of the semiconductor layer 13 opposite to the insulating film 12 provides the surface 10*a* of the first substrate 10. The support substrate 11 and the semiconductor layer 13 are provided by silicon substrates or the like. The insulating film 12 is provided by an oxide film or the like.

The first substrate 10 is formed with a sensing part 20 on a side adjacent to the surface 10*a*, that is, in the semiconductor layer 13. The sensing part 20 outputs a sensor signal according to an angular velocity. In the present embodiment, the sensing part 20 includes a driving unit, a fixation unit and a vibration unit having a vibrator, for example. The vibration unit is driven to vibrate in a predetermined direction by the driving unit. When an angular velocity is applied, the vibration unit is vibrated for sensing in accordance with a Coriolis force. As a result, the sensing part 20 outputs the sensor signal in accordance with the change in capacitance between the fixation unit and the vibration unit.

The support substrate 11 is formed with a recessed part 14 at a part facing the sensing part 20. The recessed part 14 is formed so as to restrict the support substrate 11 from contacting with the sensing part 20. In the present embodiment, the insulating film 12 is formed also on a wall surface of the recessed part 14. Alternatively, the insulating film 12 may not be formed on the wall surface of the recessed part 14.

The second substrate 40 is boned on the surface 10*a* of the first substrate 10 through the insulating film 30. In other words, the insulating film 30 is arranged between the surface 10*a* of the first substrate 10 and a surface 40*a* of the second substrate 40. The second substrate 40 is provided by a silicon substrate or the like. The second substrate 40 has the surface 40*a* adjacent to the first substrate 10, and a surface 40*b* opposite to the surface 40*a*. The second substrate 40 is formed with a recessed part 41 at an area facing the sensing part 20. The surface 40*a* of the second substrate 40 adjacent to the first substrate 10 will also be referred to as a second surface 40*a*.

When the first substrate 10 and the second substrate 40 are bonded to each other through the insulating film 30, a hermetically sealed chamber 50 is provided by the recessed part 14 of the first substrate 10 and the recessed part 41 of the second substrate 40, and the sensing part 20 is enclosed in the hermetically sealed chamber 50. The hermetically sealed chamber 50 has a vacuum pressure of 100 Pa or less, in the present embodiment. For example, the hermetically sealed chamber 50 has a low pressure such as approximately 10 Pa.

Figure 2:
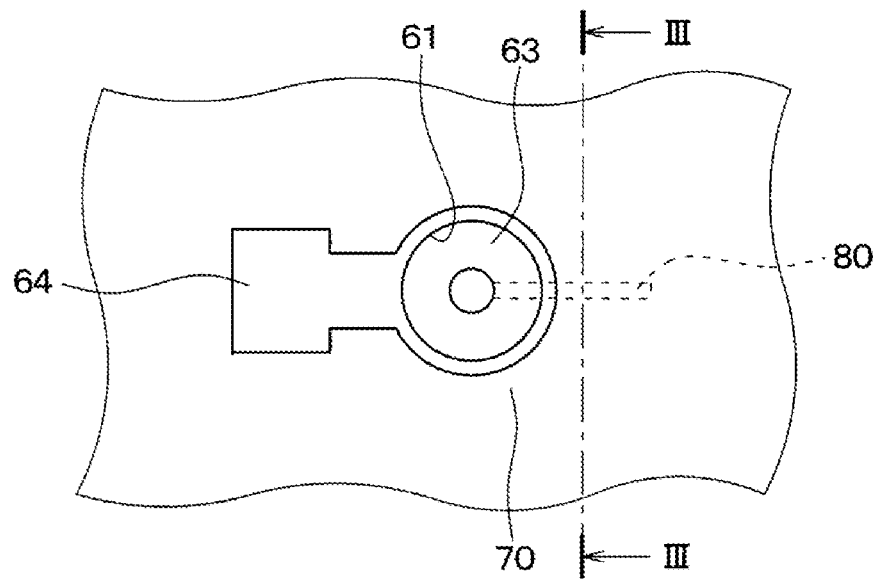
FIG. 2 is a diagram illustrating a plan view of the semiconductor device around a penetrating electrode shown in FIG. 1.

As shown in FIG. 1 and FIG. 2, the second substrate 40 and the insulating film 30 are formed with a through hole 61 that passes through the second substrate 40 and the insulating film 30 in a stacked direction of the first substrate 10 and the second substrate 40, so as to allow the first surface 10a of the first substrate 10 to expose through the through hole 61. In particular, the second substrate 40 and the insulating film 30 are formed with the through hole 61 that exposes a portion of the sensing part 20. The portion of the sensing part 20 is a wiring portion connected to the driving unit, the fixation unit and the vibration unit or the like. In FIG. 1, although only one through hole 61 is illustrated, another through hole 61 is formed in another section. That is, the semiconductor device has a plurality of through holes 61.

On a wall surface of the through hole 61, an insulating film 62 is formed. Further, a penetrating electrode 63 is formed on the wall surface of the through hole 61 through the insulating film 62. The insulating film 62 is made of tetraethoxysilane (TEOS), or the like. The penetrating electrode 63 is made of aluminum, polysilicon, or the like. The penetrating electrode 63 is electrically connected to the sensing part 20. On the surface 40b of the second substrate 40 opposite to the first substrate 10, an insulating film 70 is formed. Further, a pad 64 is formed on the insulating film 70 to be electrically connected to the penetrating electrode 63.

The semiconductor device of the present embodiment has the basic configurations as described hereinabove. The semiconductor device is provided with a discharge path 80 at a position located between the hermetically sealed chamber 50 and the through hole 61. In the present embodiment, the discharge path 80 is provided by a space defined by a recess 31 and the first substrate 10. The recess 31 is formed in the insulating film 30 at a position located between the hermetically sealed chamber 50 and the through hole 61.

As described above, the semiconductor device has multiple through holes 61. In this case, multiple recesses 31 are formed correspondingly to the multiple through holes 61. That is, the recesses 31 are formed at positions located between the hermetically sealed chamber 50 and the respective through holes 61. Thus, the number of the recesses 31, that is, the number of the discharge paths 80 is the same as the number of the through holes 61.

Figure 3:
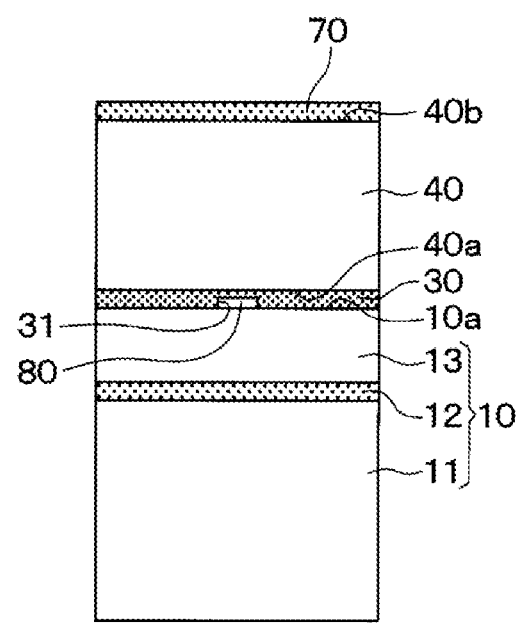
FIG. 3 is a diagram illustrating a cross-sectional view taken along a line III-III in FIG. 2.

As shown in FIGS. 1 and 3, in the present embodiment, each recess 31 is formed in the insulating film 30 so as not to expose the surface 40a of the second substrate 40. That is, the recess 31 is formed to extend from a surface of the insulating film 30 facing the first substrate 10 to an intermediate position of the insulating film 30. In other words, the recess 31 is formed from the surface of the insulating film 30 facing the first substrate 10 to a position without reaching an opposite surface of the insulating film 30 facing the surface 40a of the second substrate 40. The recess 31 has a rectangular shape in a cross-section taken in a direction that is perpendicular to the plane of the insulating film 31 and perpendicular to a direction connecting the hermetically sealed chamber 50 and the corresponding through hole 61. The distance (length) L between the recess 31 and the hermetically sealed chamber 50 is approximately 10 micrometers (μm). Further, the recess 31, that is, the discharge path 80 is apart from the hermetically sealed chamber 50 and the through hole 61.

In the present embodiment, the first substrate 10, the second substrate 40, and the insulating film 30 are opposed to one another and bonded to one another in an entire area located between the hermetically sealed chamber 50 and the through hole 61, but excluding a position corresponding to the discharge path 80. That is, the insulating film 30 is formed with the recess 31 so as to provide the discharge path 80. As such, the first substrate 10 and the insulating film 30 are bonded to one another in an entire area located between the hermetically sealed chamber 50 and the through hole 61, excluding a position corresponding to the discharge path 80, so as to have the bonding surface. In regard to the insulating film 30 and the second substrate 40, since the discharge path 80 is not formed between the insulating film 30 and the second substrate 40 in the area located between the hermetically sealed chamber 50 and the through hole 61, the insulating film 30 and the second substrate 40 in the area are entirely bonded to each other, to thereby form the bonding surface.

The semiconductor device of the present embodiment has the configuration as described above. Next, a method for producing the semiconductor device will be described with reference to FIGS. 4A to 4F.

Figure 4A:
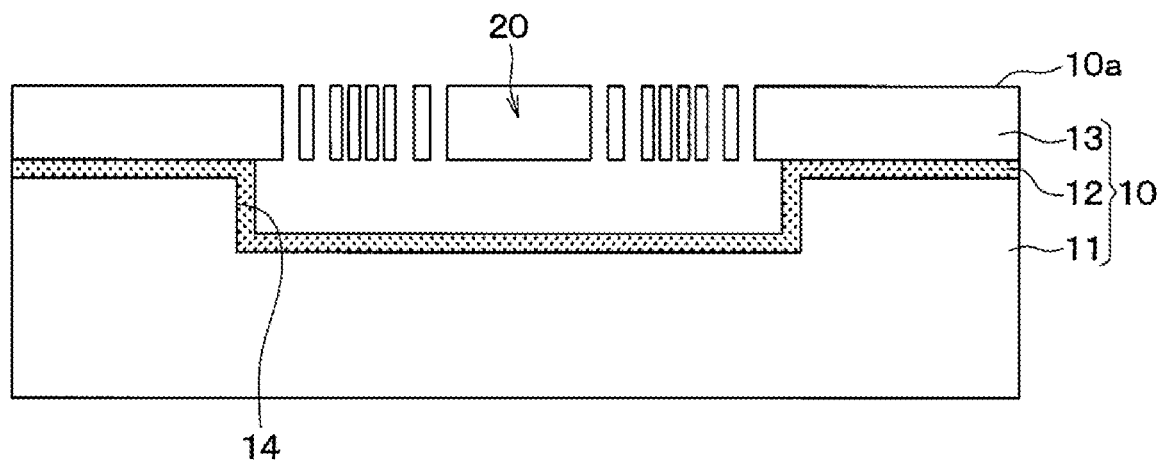
FIG. 4A is a diagram illustrating a cross-sectional view for explaining a step for producing the semiconductor device shown in FIG. 1.

As shown in FIG. 4A, a first substrate 10 in which an insulating film 12 and a semiconductor layer 13 are stacked orderly on a support substrate 11 formed with a recessed part 14 is prepared. Then, a mask (not shown) is formed on a surface 10a of the first substrate 10, and a dry etching or the like is performed so as to form a sensing part 20 in the first substrate 10. In the preparation of the first substrate 10, for example, the recessed part 14 is formed in the support substrate 11, the insulating film 12 is then formed, and the semiconductor layer 13 is further bonded thereon.

Figure 4B:
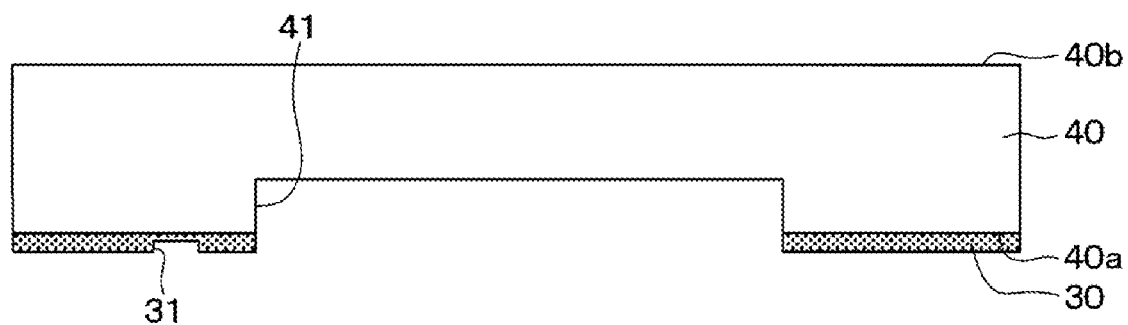
FIG. 4B is a diagram illustrating a cross-sectional view for explaining a step for producing the semiconductor device shown in FIG. 1.

As a process separate from the process shown in FIG. 4A, a second substrate 40 is prepared, and an insulating film 30 is formed on a surface 40a of the second substrate 40, as shown in FIG. 4B. Thereafter, a mask (not shown) is formed on the insulating film 30, and a dry etching or the like is performed so as to form a recess 31 in the insulating film 30 and a recessed part 41 in the insulating film 30 and the second substrate 40. In this case, the recess 31 is formed at a position to be communicated with a through hole 61, which will be formed later. The recessed part 41 is formed at a position to face the sensing part 20 when the first substrate 10 and the second substrate 40 are bonded to each other, which will be described later.

Figure 4C:
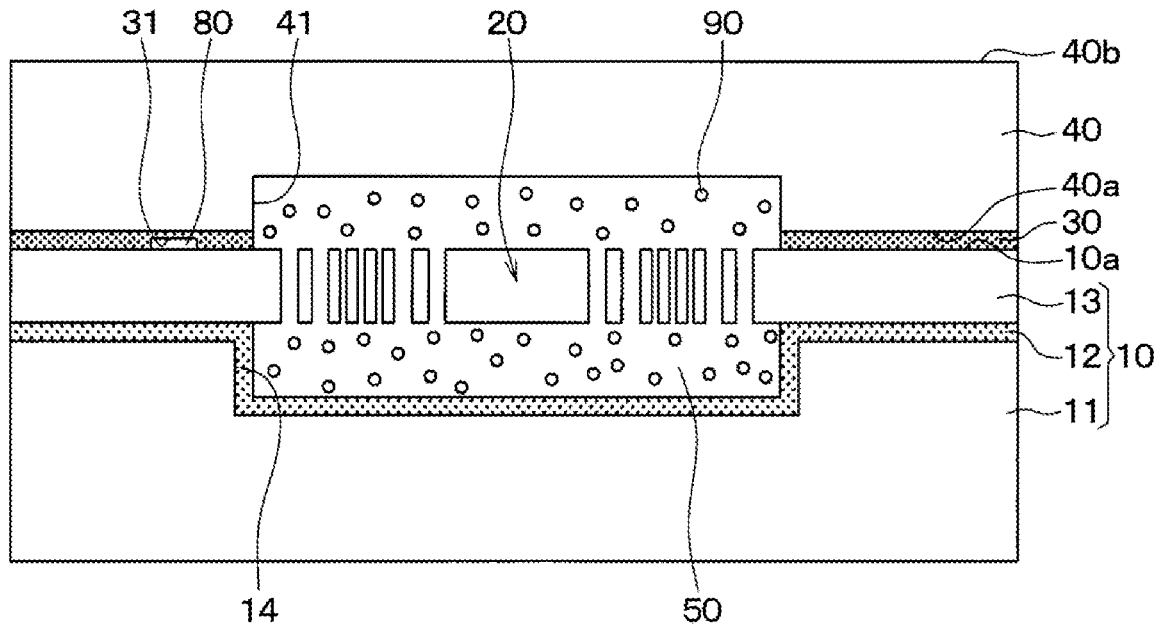
FIG. 4C is a diagram illustrating a cross-sectional view for explaining a step for producing the semiconductor device subsequent to the steps shown in FIGS. 4A and 4B.

As shown in FIG. 4C, the first substrate 10 and the second substrate 40 are bonded to each other through the insulating film 30. In the present embodiment, firstly, $O_2$ plasma, $N_2$ plasma, Ar ion beam, or the like is applied to a bonding surface of the first substrate 10 and a bonding surface of the insulating film 30 so as to remove impurities on the bonding surfaces as well as to activate the bonding surfaces.

Next, the first substrate 10 and the second substrate 40 are aligned to each other, and bonded to each other. In the alignment, the first substrate 10 and the second substrate 40 are aligned to each other under an infrared microscope, for example, using alignment marks, which are provided in the first substrate 10 and the second substrate 40 as necessary. Thus, a hermetically sealed chamber 50 is formed between the first substrate 10 and the second substrate 40, and the sensing part 20 is enclosed in the hermetically sealed chamber 50. Further, a discharge path 80 is provided by the recess 31 formed in the insulating film 30.

Thereafter, as the bonding step, a heat treatment is performed, as necessary, so as to improve the bonding strength between the first substrate 10 and the second substrate 40. In the heat treatment, the first substrate 10 and the second substrate 40 are heated to the temperature in a range from a room temperature to approximately 900 degrees Celsius (° C.), for example.

In the case where the first substrate 10 and the second substrate 40 are bonded in the manner described above, the first substrate 10 and the second substrate 40 adsorb moisture and nitrogen in the atmosphere due to the first substrate 10 and the second substrate 40 being exposed to the atmosphere after the activation of the bonding surfaces. When the bonding and/or the heat treatment is performed, water adsorbed is decomposed into hydrogen and oxygen. The oxygen is introduced into an oxide film, whereas the hydrogen remains in the hermetically sealed chamber 50. The nitrogen is desorbed from an inner wall surface of the hermetically sealed chamber 50 and released into the hermetically sealed chamber 50. Thus, the hermetically sealed chamber 50 is in a state where outgas 90 containing hydrogen gas and nitrogen gas are enclosed in the hermetically sealed chamber 50.

Figure 4D:
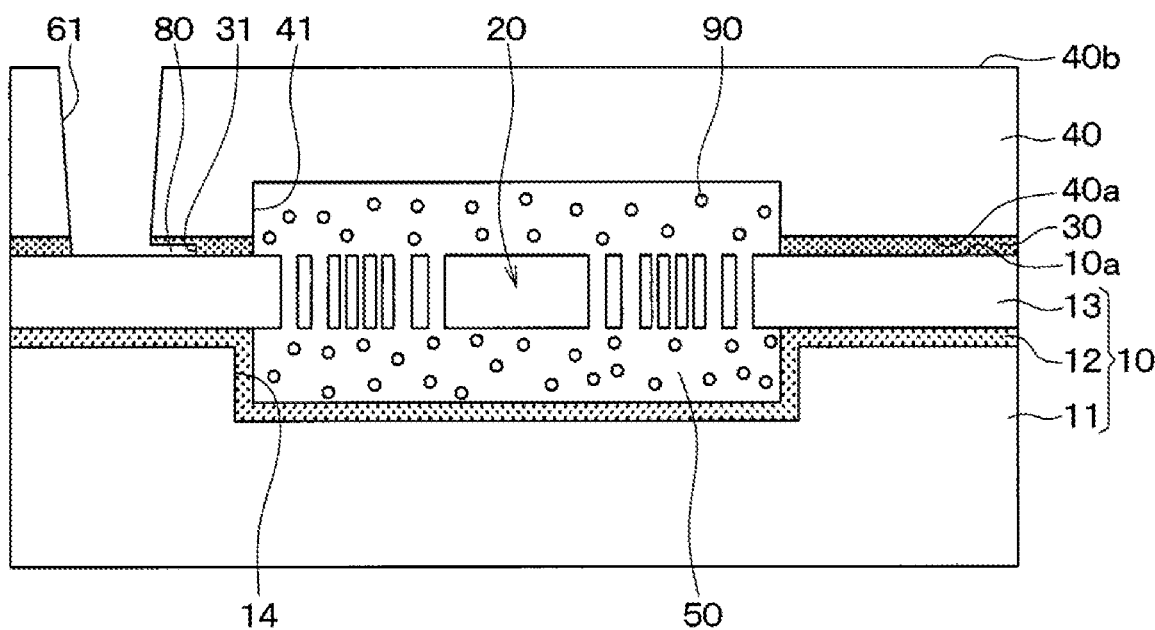
FIG. 4D is a diagram illustrating a cross-sectional view for explaining a step for producing the semiconductor device subsequent to the step shown in FIG. 4C.

Next, as shown in FIG. 4D, a mask (not shown) is formed on the second substrate 40, and a dry etching or the like is performed to form a through hole 61 that penetrates the second substrate 40 and the insulating film 30 in a stacked direction of the first substrate 10 and the second substrate 40 and exposes the sensing part 20. In the present embodiment, the through hole 61 is formed so as to be in communication with the recess 31 of the insulating film 30. In FIG. 4D, only one through hole 61 is illustrated. However, the through hole 61 is formed also in another section. Each of the through holes 61 is formed to be in communication with the corresponding recess 31.

Figure 4E:
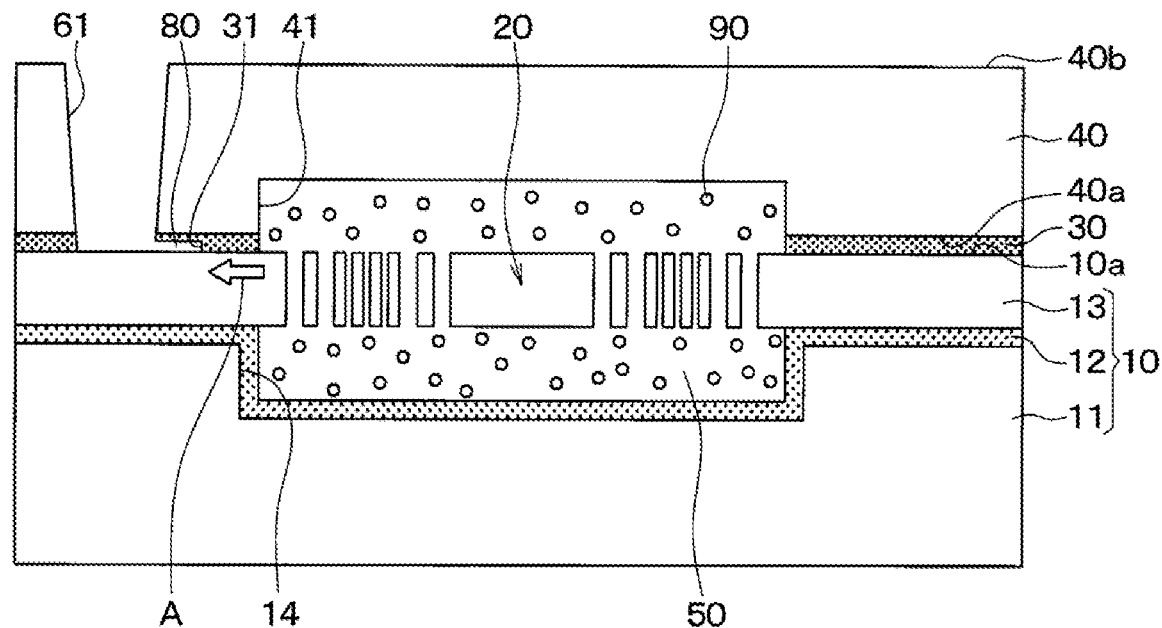
FIG. 4E is a diagram illustrating a cross-sectional view for explaining a step for producing the semiconductor device subsequent to the step shown in FIG. 4D.

As shown in FIG. 4E, a heat treatment is then performed so as to activate the outgas 90, so that the outgas 90 is diffused to the discharge path 80 along a bonding interface between Si and SiO$_2$ at which the energy barrier is the lowest. That is, the outgas 90 is diffused up to the discharge path 80 along the bonding interface between the surface 10a of the first substrate 10 and the insulating film 30. Thereafter, the outgas 90 is discharged from the discharge path 80 to the outside through the through hole 61. As such, the distance of diffusing the outgas 90 can be shortened, as compared with the configuration without having the discharge path 80. Accordingly, the gas releasing process can be shortened.

In the gas releasing process of the present embodiment, the heat treatment is conducted at the temperature higher than that of the bonding. For example, the heat treatment in the gas releasing process is conducted at a temperature in a range from 900° C. to 1100° C. In this case, the outgas 90 generated in the hermetically sealed chamber 50 is discharged as well as the nitrogen gas or the like adhered on the inner wall surface of the hermetically sealed chamber 50 can be released as the outgas 90 and discharged.

Figure 4F:
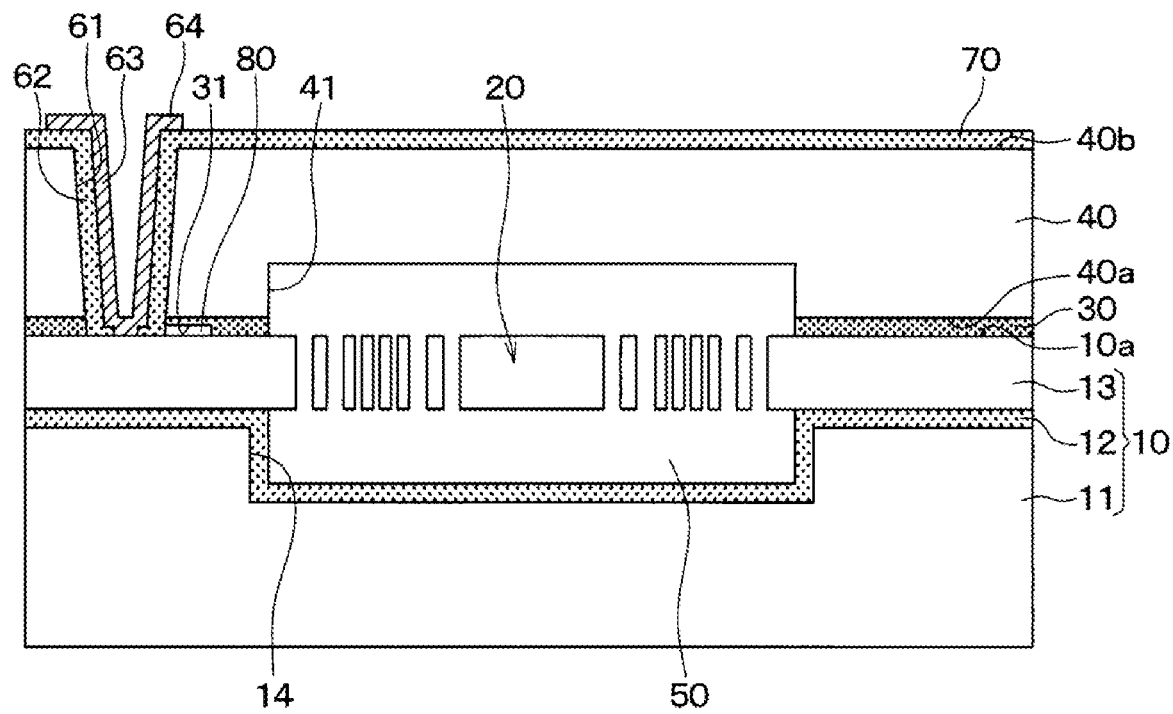
FIG. 4F is a diagram illustrating a cross-sectional view for explaining a step for producing the semiconductor device subsequent to the step shown in FIG. 4E.

As shown in FIG. 4F, an insulating film 62 is then formed on a wall surface of each through hole 61. The insulating film 62 is made of TEOS or the like. In this case, the insulating film 62 is provided by the insulating film 70 formed on the surface 40b of the second substrate 40. Since the insulating film is formed also at a position where the through hole 61 is in communication with the recess 31, the discharge path 80 is in a closed state.

Next, the insulating film formed at the bottom of the through hole 61 is removed. In this case, the insulating film at the bottom of the through hole 61 is removed so that the insulating film closing the discharge path 80 remains, that is, the closed state of the discharge path by the insulating film is kept. Then, a penetrating electrode 63 is formed by forming a conductive film, which is made of aluminum, polysilicon or the like, by a sputtering or vapor deposition technique. Thereafter, the conductive film formed on the insulating film 70 is suitably patterned so as to form pad portions 64. In this way, the semiconductor device of the present embodiment is produced.

The method for producing one semiconductor device has been described hereinabove. Alternatively, the semiconductor device may be produced by preparing the first substrate 10 and the second substrate 40 in wafers, performing the respective steps described above to the first substrate 10 and the second substrate 40 in wafers, and dice-cutting the wafers into chips.

The discharge path 80 remains even after the semiconductor device is produced. Therefore, the outgas 90 in the hermetically sealed chamber 50 can be readily discharged by performing the heat treatment during use of the semiconductor device, as compared with the configuration without having the discharge path 80. In the case of discharging the outgas 90 from the hermetically sealed chamber 50 during the use of the semiconductor device, the outgas 90 is diffused along the bonding interface between the surface 10a of the first substrate 10 and the insulating film 30 to reach the discharge path 80, and is then discharged into the through hole 61 through grain boundaries of the material of the penetrating electrode 63.

In the present embodiment, as described hereinabove, the discharge path 80 is formed between the hermetically sealed chamber 50 and the through hole 61. The outgas 90 is discharged from the through hole 61 via the discharge path 80 by the heat treatment. Therefore, the hermetically sealed chamber 50 can be kept at a low pressure. The distance of diffusing the outgas 90 can be shortened, as compared with the configuration without having the discharge path 80. As such, the gas releasing is readily performed.

The discharge path 80 remains even after the semiconductor device is produced. Therefore, when the outgas 90 inside of the hermetically sealed chamber 50 is discharged by performing the heat treatment during the use of the semiconductor device, the outgas 90 can be readily discharged, as compared with the configuration without having the discharge path 80.

The first substrate 10, the second substrate 40, the insulating film 30 are bonded to each other in the whole area located between the hermetically sealed chamber 50 and the through hole 61, but excluding the portions where the discharge paths 80 are formed. Therefore, it is less likely that the bonding strength will be weakened.

(Modifications of the First Embodiment)

Figure 5A:
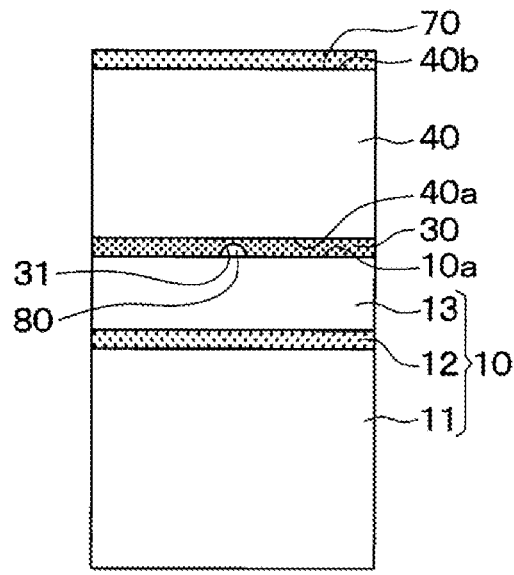
FIG. 5A is a diagram illustrating a cross-sectional view of a discharge path as a modification of the first embodiment.
Figure 5B:
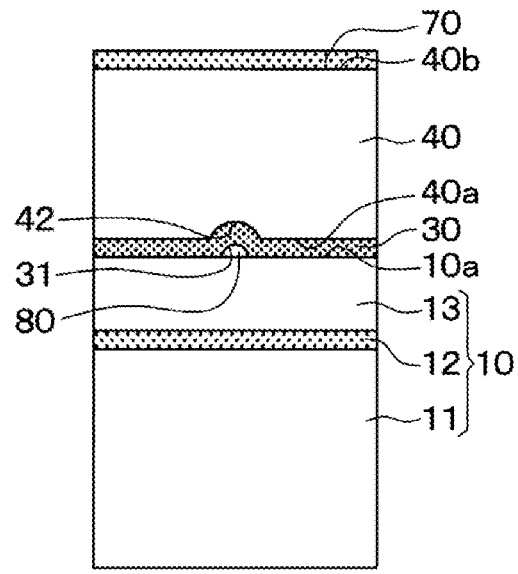
FIG. 5B is a diagram illustrating a cross-sectional view of a discharge path as another modification of the first embodiment.

Modifications of the first embodiment will be described hereinafter. As a modification of the first embodiment described above, for example, the recess 31 (i.e., the discharge path 80) may have semi-circular shapes in cross-section, as shown in FIG. 5A and FIG. 5B. The recess 31 shown in FIG. 5A is, for example, formed by performing a wet-etching to the insulating film 30. The recess 31 shown in FIG. 5B is, for example, formed in such a manner that a recess 42 is formed on the surface 40a of the second substrate 40 by a wet-etching, and then the insulating film 30 is formed along the wall surface of the recess 42.

Figure 5C:
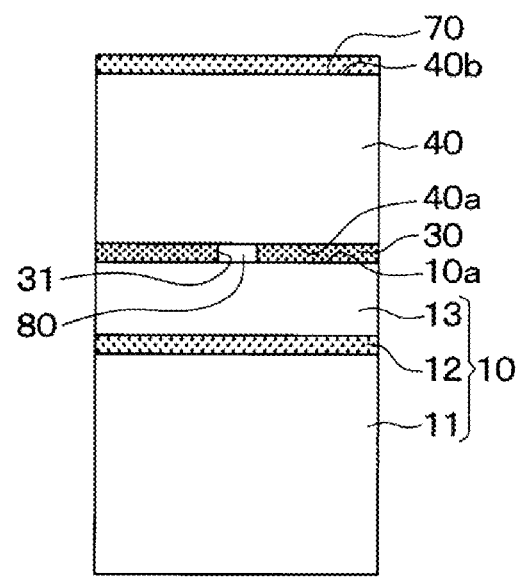
FIG. 5C is a diagram illustrating a cross-sectional view of a discharge path as a further another modification of the first embodiment.

As shown in FIG. 5C, the recess 31 (i.e., the discharge path 80) may be formed so as to expose the surface 40a of the second substrate 40. That is, the discharge path 80 may be provided by a space surrounded by the surface 10a of the first substrate 10, the surface 40a of the second substrate 40 and the insulating film 30.

Figure 5D:
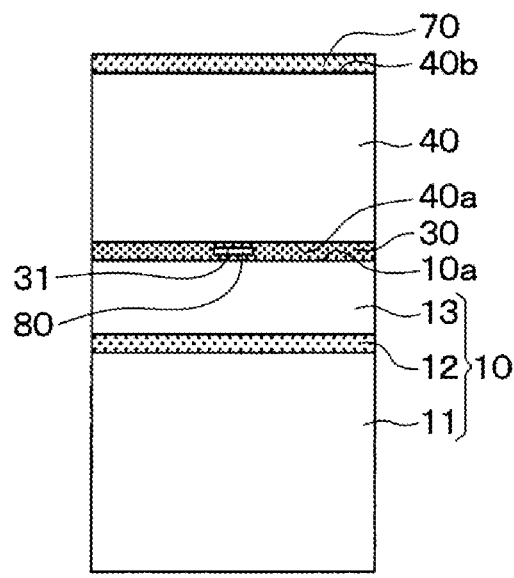
FIG. 5D is a diagram illustrating a cross-sectional view of a discharge path as a yet another modification of the first embodiment.

As shown in FIG. 5D, the recess 31 (i.e., he discharge path 80) may be formed so as to reside inside of the insulating film 30. Such a recess 31 is formed by newly forming an insulating film on a position inside of the recess 31 of the first substrate 10 by thermal oxidation, in the step shown in FIG. 4F.

Second Embodiment

A second embodiment will be described. In the second embodiment, the configuration of the discharge path 80 is modified from that of the first embodiment. The other configurations of the second embodiment will be similar to those of the first embodiment, and thus descriptions thereof will not be repeated.

Figure 6:
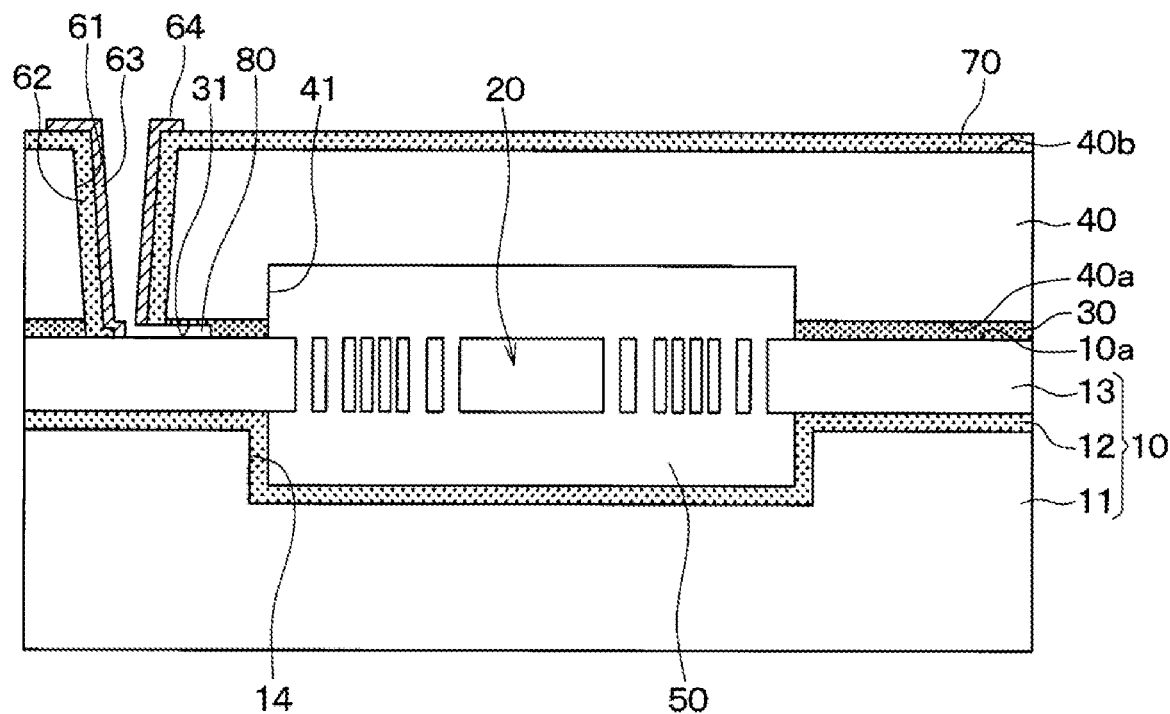
FIG. 6 is a diagram illustrating a cross-sectional view of a semiconductor device according to a second embodiment of the present disclosure.

In the present embodiment, as shown in FIG. 6, the recess 31 is formed to be in communication with the through hole 61, but be away from the hermetically sealed chamber 50. That is, the discharge path 80 is formed to be in communication with the through hole 61, but be away from the hermetically sealed chamber 50.

The semiconductor device is produced, for example, in a following manner. That is, when the insulating film 62, which is formed in the through hole 61, is removed from the bottom of the through hole 61 in the step of FIG. 4F, the insulating film 62 is removed so that the recess 31 and the through hole 61 are in communication with each other again. Thereafter, when the penetrating electrode 63 is formed by forming the metal film, the amount of film formation is controlled so that the recess 31 is not closed with the metal film. In this way, the semiconductor device shown in FIG. 6 is produced.

Also in the semiconductor device where the discharge path 80 is in communication with the through hole 61, the similar effects to the first embodiment will be achieved. In the semiconductor device of the present embodiment, when the heat treatment is performed to discharge the outgas 90 during the use of the semiconductor device, the outgas 90 can be readily discharged as the discharge path 80 being not closed.

Third Embodiment

A third embodiment will be described. In the third embodiment, the configuration of the discharge path 80 is modified from that of the first embodiment. The other configurations of the third embodiment will be similar to those of the first embodiment, and thus descriptions thereof will not be repeated.

Figure 7:
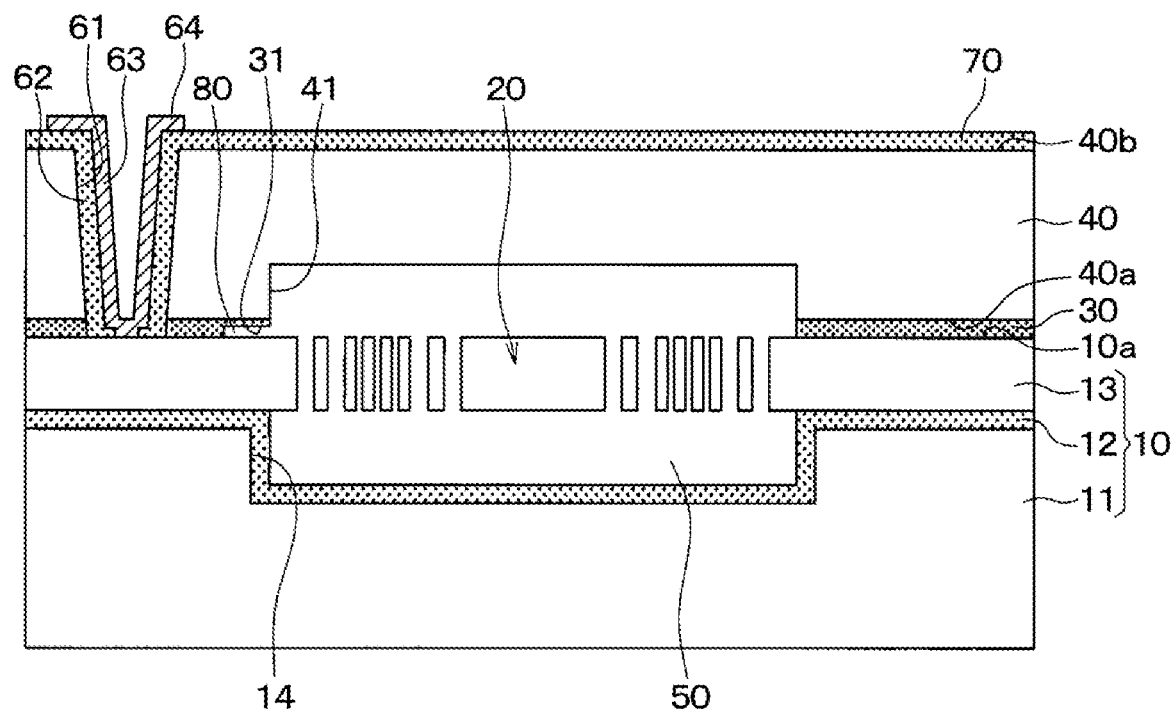
FIG. 7 is a diagram illustrating a cross-sectional view of a semiconductor device according to a third embodiment of the present disclosure.

In the present embodiment, as shown in FIG. 7, the recess 31 is in communication with the hermetically sealed chamber 50, but is away from the through hole 61. That is, the discharge path 80 is in communication with the hermetically sealed chamber 50, but is away from the through hole 61.

The semiconductor device of the present embodiment is produced by forming the recess 31 to be connected to the recessed part 41, when forming the recess 31 in the step of FIG. 4B.

Also in the semiconductor device in which the discharge path 80 is in communication with the hermetically sealed chamber 50, the similar effects to those of the first embodiment can be achieved. Further, the semiconductor device is produced by forming the recess 31 to be connected to the recessed part 41 in the step of FIG. 4B. In this case, a specific positioning is not necessary, as compared with the configuration in which the through hole 61 is formed to be in communication with the recess 31. As such, the production process can be shortened.

Fourth Embodiment

A fourth embodiment will be described. In the fourth embodiment, the configuration of the discharge path 80 is modified from that of the first embodiment. The other configurations of the fourth embodiment are similar to those of the first embodiment, and descriptions thereof will not be repeated.

Figure 8:
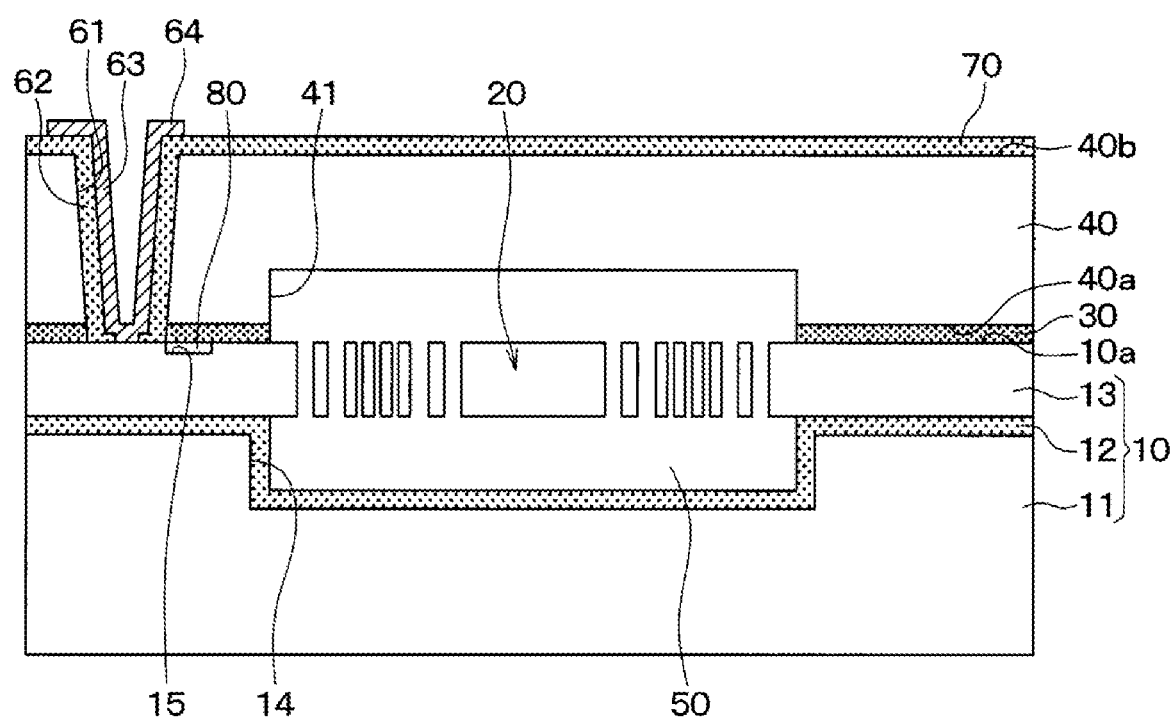
FIG. 8 is a diagram illustrating a cross-sectional view of a semiconductor device according to a fourth embodiment of the present disclosure.

As shown in FIG. 8, in the present embodiment, a recess 51 is formed in the first substrate 10 at a position located between the hermetically sealed chamber 50 and the through hole 61. The discharge path 80 is provided by a space surrounded by the recess 15 and the insulating film 30.

The semiconductor device of the present embodiment is produced, for example, by forming the recess 15 when the sensing part 20 is formed in the step of FIG. 4A.

Also in the semiconductor device in which the discharge path 80 is provided by the recess 15 formed in the first substrate 10, the similar effects to those of the first embodiment will be achieved.

Other Embodiments

While only the selected exemplary embodiment and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment and examples according to the present disclosure is provided for illustration only, and not for the purpose of limiting the disclosure as defined by the appended claims and their equivalents.

In each of the embodiments described hereinabove, for example, the insulating film 30 may be bonded to the surface 10a of the first substrate 10, when the semiconductor device is produced. When the first substrate 10 and the second substrate 40 are bonded, the surface 40a of the second substrate 40 is bonded to the insulating film 30 formed on the surface 10a of the first substrate 10. In this case, the discharge path 80 may be provided by forming a recess 31 in the insulating film 30 on the surface 10a of the first substrate 10. Alternatively, the discharge path 80 may be provided by forming a recess in the surface 40a of the second substrate 40.

In each of the embodiments described hereinabove, it is not always necessary that the discharge paths 80 are formed correspondingly for all the through holes 61. That is, the number of the discharge paths 80 may be smaller than the number of the through holes 61. The discharge path 80 may be formed at least at a part between the through holes 61 and the hermetically sealed chamber 50. That is, at least one discharge path 80 may be formed between the through holes 61 and the hermetically sealed chamber 50.

In each of the embodiments described hereinabove, the first substrate 10 is not limited to the SOI substrate, but may be provided by another substrate such as a silicon substrate. The second substrate 40 is not limited to the silicon substrate, but may be provided by another substrate such as a glass substrate.

In each of the embodiments described hereinabove, the semiconductor device is not limited to the angular velocity sensor, but may be applied to any other sensors. For example, each of the embodiments described hereinabove may be employed to a vibration-type acceleration sensor.

The embodiments described hereinabove may be combined in various ways. For example, the fourth embodiment may be combined to any of the first to third embodiments, so that the recess 15 is formed in the first substrate 10.

What is claimed is:

1. A semiconductor device comprising:
   a first substrate having a first surface;
   a second substrate having a second surface, the second substrate being bonded to the first substrate such that the second surface faces the first surface of the first substrate and a hermetically sealed chamber is provided between the first substrate and the second substrate, the second substrate having a through hole that penetrates the second substrate in a stacking direction of the first substrate and the second substrate and exposes the first surface of the first substrate;
   an insulating film disposed between the first surface of the first substrate and the second surface of the second substrate;
   a sensing part disposed in the hermetically sealed chamber, the sensing part including a vibrator;
   a penetrating electrode disposed on a wall surface of the through hole of the second substrate, the penetrating electrode being electrically connected to the sensing part; and
   a discharge path defining a space, at a position located between the hermetically sealed chamber and the through hole.

2. The semiconductor device according to claim 1, wherein
   the discharge path is disposed at the position that is away from the hermetically sealed chamber and the through hole.

3. The semiconductor device according to claim 1, wherein
   the discharge path is disposed at the position that is in communication with the through hole and is away from the hermetically sealed chamber.

4. The semiconductor device according to claim 1, wherein
   the discharge path is disposed at the position that is in communication with the hermetically sealed chamber and is away from the through hole.

5. The semiconductor device according to claim 1, wherein
   the first substrate, the second substrate and the insulating film are bonded to each other entirely in an area between the hermetically sealed chamber and the through hole excluding the position where the discharge path is provided.

6. A method for producing a semiconductor device, comprising:
   preparing a first substrate having a first surface;
   forming a sensing part in the first substrate adjacent to the first surface;
   preparing a second substrate having a second surface;
   forming an insulating film on at least one of the first substrate and the second substrate;
   bonding the first surface of the first substrate and the second surface of the second substrate through the insulating film to provide a hermetically sealed chamber between the first substrate and the second substrate and to enclose the sensing part including a vibrator in the hermetically sealed chamber;
   forming a through hole in the second substrate and the insulating film in a stacking direction of the first substrate and the second substrate to expose the first surface of the first substrate;
   forming a penetrating electrode in the through hole to be electrically connected to the sensing part; and
   before the bonding, forming a recess at a position that is to be located between the hermetically sealed chamber and the through hole in the bonding and the forming of the through hole, wherein
   in the bonding, the first surface of the first substrate and the second surface of the second substrate are bonded through the insulating film so that a discharge path is provided by the recess at the position that is to be located between the hermetically sealed chamber and the through hole in the forming of the through hole,
   the method further comprising:
   after the forming of the through hole and before the forming of the penetrating electrode, performing a heat treatment to release outgas, which is generated in the bonding, from the hermetically sealed chamber to the through hole through the discharge path.

7. The method according to claim 6, wherein
   the heat treatment to release the outgas is performed at a temperature higher than a temperature of the bonding.

* * * * *